(12) United States Patent
Takeuchi (10) Patent No.: US 9,899,598 B2
(45) Date of Patent: Feb. 20, 2018

(54) ORGANIC ELECTROLUMINESCENT ELEMENT

(71) Applicant: Konica Minolta, Inc., Tokyo (JP)

(72) Inventor: Daisuke Takeuchi, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/786,073

(22) PCT Filed: Apr. 16, 2014

(86) PCT No.: PCT/JP2014/060802
§ 371 (c)(1),
(2) Date: Oct. 21, 2015

(87) PCT Pub. No.: WO2014/178282
PCT Pub. Date: Nov. 6, 2014

(65) Prior Publication Data
US 2016/0072069 A1    Mar. 10, 2016

(30) Foreign Application Priority Data

May 1, 2013   (JP) ................................ 2013-096116

(51) Int. Cl.
*H01L 51/00* (2006.01)
*H01L 51/52* (2006.01)
(Continued)

(52) U.S. Cl.
CPC ...... *H01L 51/0023* (2013.01); *H01L 27/3209* (2013.01); *H01L 51/0097* (2013.01);
(Continued)

(58) Field of Classification Search
CPC .................................................. C09K 11/06
See application file for complete search history.

(56) References Cited

U.S. PATENT DOCUMENTS

| 6,358,631 | B1 * | 3/2002 | Forrest | C09K 11/06 |
| | | | | 257/E33.056 |
| 2004/0183072 | A1 * | 9/2004 | Kim | H01L 29/41733 |
| | | | | 257/59 |
| 2006/0214596 | A1 | 9/2006 | Miller et al. | |

FOREIGN PATENT DOCUMENTS

| CN | 1170383 A | 1/1998 |
| JP | 2000516273 A | 12/2000 |

(Continued)

OTHER PUBLICATIONS

International Search Report dated May 20, 2014 for Application No. PCT/JP2014/060802 and English translation.
(Continued)

*Primary Examiner* — Fernando L Toledo
*Assistant Examiner* — Valerie N Newton
(74) *Attorney, Agent, or Firm* — Lucas & Mercanti, LLP (57) ABSTRACT

The objective of the present invention is to provide an organic electroluminescent element which exhibits excellent light transmitting properties by having an intermediate electrode that is formed as a thin film, and which is suppressed in disconnection or resistance increase of the intermediate electrode, thereby being ensured with respect to electrical conductivity. This organic EL element (100) comprises light emitting units (4-6) which include at least a light emitting layer and are arranged between a first electrode (2) that is formed on a substrate (1) and a second electrode (3) that faces the first electrode (2); and each one of the light emitting units (4-6) independently emits light by having intermediate electrodes (7, 8), which are arranged between the light emitting units (4-6), connected to an external power supply via first lead-out wiring lines (10, 11). This organic EL element (100) is characterized in that: the light emitting units (5, 6) arranged adjacent to the intermediate electrodes (7, 8) are pattern formed such that the intermediate elec- (Continued)

trodes (7, 8) are partially exposed therefrom when viewed from the lamination direction; and the first lead-out wiring lines (10, 11) are connected to the exposed portions of the intermediate electrodes (7, 8).

11 Claims, 5 Drawing Sheets (51) Int. Cl.
*H01L 27/32* (2006.01)
*H01L 51/56* (2006.01)

(52) U.S. Cl.
CPC ...... *H01L 51/5212* (2013.01); *H01L 51/5228* (2013.01); *H01L 51/5278* (2013.01); *H01L 51/56* (2013.01); *H01L 2251/5338* (2013.01); *H01L 2251/558* (2013.01)

(56) References Cited

FOREIGN PATENT DOCUMENTS

| | | |
|---|---|---|
| JP | 2005-294058 | 10/2005 |
| JP | 205294058 A | 10/2005 |
| JP | 2005294058 A | 10/2005 |
| JP | 2009252458 A | 10/2009 |
| JP | 2011-034901 A | 2/2011 |
| WO | 2005-043961 A2 | 5/2005 |

OTHER PUBLICATIONS

Office Action dated Jun. 23, 2016 from the corresponding Chinese Application; Application No. 201480024388.7; Applicant: Konica Minolta, Inc.; Title of the Invention: Organic Electroluminescent Element; Total of 22 pages.

International Search Report; International Application No. PCT/JP2014/060802; International filing date: Apr. 16, 2014; Applicant: Konica Minolta, Inc.; total of 4 pages; English Translation of International Search Report; total of 5 pages; Grand total of 9 pages.

Extended European Search Report dated Nov. 16, 2016 from corresponding European Application; Application No./Patent No. 14791914.6-1555 / 2993963 PCT/JP2014060802; Applicant: Konica Minolta, Inc.; Total of 8 pages.

Office Action dated Aug. 23, 2016 from the corresponding Korean Application; Patent Application No. 10-2015-7030744; Applicant: Konica Minolta Inc.; Title of Invention: Organic Electroluminescent Element; English translation of Office Action; Total of 7 pages.

Office Action dated Apr. 1, 2017 from corresponding Chinese Patent Application No. 201480024388.7; Applicant: Konica Minolta, Inc; English translation of Office Action: Total of 20 pages.

Notice of Reason for Rejection dated Aug. 29, 2017 from corresponding Japanese Patent Application No. JP 2015-514804 and English translation.

Notice of Final Rejection dated Feb. 28, 2017 from corresponding Korean Patent Application No. KR 10-2015-7030744; Applicant: Konica Minolta, Inc.; English translation of Notice of Final Rejection; Total of 6 pages.

Office Action dated Oct. 26, 2017 from corresponding Chinese Application No. CN 201480024388.7 and English translation.

* cited by examiner

ORGANIC ELECTROLUMINESCENT ELEMENT

CROSS REFERENCE TO RELATED APPLICATION

This Application is a 371 of PCT/JP2014/060802 filed on Apr. 16, 2014, which, in turn, claimed the priority of Japanese Patent Application No. JP2013-096116 filed on May 1, 2013, both applications are incorporated herein by reference.

TECHNICAL FIELD

The present invention relates to an organic electroluminescent element. In particular, the present invention relates to an organic electroluminescent element with excellent translucency by having a thin intermediate electrode and with high conductivity by suppressing breakage or an increase in resistance of the intermediate electrode.

BACKGROUND ART

In recent years, organic electroluminescent elements (hereinafter also referred to as "organic EL elements") have been under extensive development and have been used in display devices and lighting devices.

Organic EL elements are thin, completely solid elements that can emit light at a low voltage of about several volts to several tens of volts, and have many advantages, such as high luminance, high emission efficiency, small thickness, and light weight. Such an organic EL element includes a pair of electrodes and a light emitting unit composed of an organic material and disposed between the electrodes. Light emitted from the light emitting unit is extracted to the outside through the electrodes.

In a typical technique for obtaining light having a desired color from an organic EL device, organic EL elements which emit light having different colors (e.g., red, green, and blue) are disposed in a stripe pattern, and the intensity of light emitted from each of the organic EL elements is controlled to produce light of any color. The technique involves a separate coating process in which organic EL elements which emit light having different colors are individually patterned on a substrate with a highly precise metal mask, or a color filter process in which color filters are disposed on a substrate in any pattern, and a white light-emitting organic EL element is disposed on the color filters.

Unfortunately, these two processes require provision of individual emission regions on a light-emitting surface, and also require provision of non-emission regions between adjacent emission regions for avoiding mixing of colors of light. Thus, the processes cause a problem in that the ratio of the emission regions to the entire light-emitting surface (aperture ratio) is very low, resulting in a significant reduction in emission efficiency. In addition, the processes require complicated production steps, leading to an increase in production cost.

In order to solve these problems, a process has been proposed which involves lamination of light emitting units which emit light having different colors in a thickness direction of an organic EL element via intermediate electrodes, rather than the planar arrangement of organic EL elements which emit light of different colors. This process allows the light emitting units to emit light independently for emission of light having any color (see, for example, PTL 1).

According to this process, the aperture ratio of each light emitting unit can be approximated to substantially 100%, resulting in a significant increase in emission efficiency. Furthermore, this process does not require patterning with a highly precise metal mask or formation of a color filter, and thus enables production steps to be simplified, probably leading to a reduction in production cost or an increase in yield.

This lamination process is more advantageous than the aforementioned two processes in terms of emission efficiency and production process, particularly in the case where the color of emitted light is appropriately varied in a device such as a lighting device which has a relatively large emission region and which does not require pixels.

Unfortunately, this lamination process poses the following problems:

An intermediate electrode disposed between each pair of adjacent light emitting units desirably has a small thickness for effective extraction of light emitted from each of the light emitting units. Specifically, the thickness of the intermediate electrode, which may vary depending on the material thereof, is desirably 20 nm or less.

The organic EL element prepared by this process includes several layers (including the light emitting unit) laminated between the intermediate electrode and the substrate. Thus, the intermediate electrode needs to be patterned to extend over a step between the layers for connection of the intermediate electrode to an external power source. If the intermediate electrode has a thickness of 20 nm or less as described above, the intermediate electrode may break at the step between the layers, or the intermediate electrode may be thinned at the step, resulting in uneven thickness of the intermediate electrode or an increase in resistance.

Thus, the lamination process has a difficult problem of achieving both high translucency and high conductivity of the intermediate electrode.

RELATED ART DOCUMENTS

Patent Documents

PTL 1: Japanese Unexamined Patent Application Publication No. 2009-252458

SUMMARY OF THE INVENTION

Problems to be Solved by the Invention

The present invention has been attained in consideration of the problems described above. An object of the present invention is to provide an organic electroluminescent element with excellent translucency by having a thin intermediate electrode and with high conductivity by suppressing breakage or an increase in resistance of the intermediate electrode.

Means for Solving the Problems

The present inventor has conducted studies to solve the problems described above, and has found that a thin intermediate electrode of an organic EL element can be connected to an external power source without causing breakage or an increase in resistance of the intermediate electrode if a light emitting unit adjacent to the intermediate electrode is patterned such that a portion of the intermediate electrode is exposed to the outside as viewed in the direction of lamination, and a first lead line is connected to the exposed portion of the intermediate electrode and to the external power source.

Accordingly, the problems described above can be solved by the following means according to the present invention.

Means for Solving the Problems

1. An organic electroluminescent element including: a substrate; a first electrode formed on the substrate; a second electrode disposed opposite to the first electrode; a plurality of light emitting units disposed between the first electrode and the second electrode, each of the light emitting units including a light emitting layer; an intermediate electrode disposed between two adjacent ones of the light emitting units; and a first lead line for connecting the intermediate electrode to an external power source to allow the light emitting units to emit light independently, wherein the light emitting unit adjacent to the intermediate electrode is patterned such that a portion of the intermediate electrode is exposed to the outside as viewed in a direction of lamination, and the first lead line is connected to the exposed portion of the intermediate electrode.
2. The organic electroluminescent element according to claim 1, further comprising a second lead line connected to the external power source and disposed on the substrate, wherein the first lead line is connected to the second lead line.
3. The organic electroluminescent element according to claim 1 or 2, wherein the first lead line is composed of a plurality of patterned segments.
4. The organic electroluminescent element according to any one of claims 1 to 3, wherein the second electrode and the first lead line are composed of the same conductive material.
5. The organic electroluminescent element according to any one of claims 1 to 4, wherein at least one of the light emitting units emits light having a color different from that of light emitted from the remaining light emitting unit(s).
6. The organic electroluminescent element according to claim 5, wherein the color of light extracted to the outside can be controlled by adjusting the intensity of light emitted from each of the light emitting units.
7. The organic electroluminescent element according to any one of claims 1 to 6, wherein the intermediate electrode includes at least one metal element selected from aluminum, silver, magnesium, and calcium.

Advantageous Effects of the Invention

The present invention can provide an organic electroluminescent element with excellent translucency due to a thin intermediate electrode and with high conductivity by suppressing breakage or an increase in resistance of the intermediate electrode.

The mechanism of expression of the advantageous effects of the present invention are expressed is as follows:

Specifically, a light emitting unit adjacent to an intermediate electrode is patterned such that a portion of the intermediate electrode is exposed to the outside as viewed in the direction of lamination, and a first lead line is connected to the exposed portion of the intermediate electrode. Accordingly, the intermediate electrode does not extend over a step between layers, but is provided in a planar form between adjacent light emitting units. Thus, the intermediate electrode can be sufficiently thinned without causing breakage or an increase in resistance, and the intermediate electrode exhibits both high translucency and high conductivity in the organic electroluminescent element.

EMBODIMENTS FOR CARRYING OUT THE INVENTION

The organic electroluminescent element of the present invention comprises a substrate, a first electrode formed on the substrate, a second electrode disposed opposite to the first electrode, a plurality of light emitting units disposed between the first electrode and the second electrode, each of the light emitting units at least including a light emitting layer, an intermediate electrode disposed between two adjacent ones of the light emitting units, and a first lead line for connecting the intermediate electrode to an external power source to allow the light emitting units to emit light independently, wherein the light emitting unit adjacent to the intermediate electrode is patterned such that a portion of the intermediate electrode is exposed to the outside as viewed in the direction of lamination, and the first lead line is connected to the exposed portion of the intermediate electrode. These technical characteristics are common to claims 1 to 7 of the present invention.

In the present invention, preferably, a second lead line is further disposed on the substrate, and the second lead line is connected to the first lead line and the external power source. This configuration can reduce interconnection resistance in the organic EL element, and achieve good connection between the organic EL element and the external power source.

In the present invention, the first lead line is preferably composed of a plurality of patterned segments. If the first lead line is patterned on the substrate in the form of a single film having a large area by vapor deposition with a metal mask, the opening of the mask needs to be widened, probably leading to a decrease in strength of the metal mask or deflection of the mask. In contrast, formation of the first lead line by a plurality of patterned segments involves use of a metal mask having a plurality of openings, resulting in prevention of a decrease in strength of the metal mask or deflection of the mask.

In the present invention, the second electrode and the first lead line are preferably composed of the same conductive material. This enables simultaneous formation of the second electrode and the first lead line, and provides the organic EL element with a simple configuration. Because the second electrode and the first lead line can be formed by a single step, the organic EL element is readily produced.

The present invention, the contexture thereof, and embodiments and aspects for implementing the present invention will now be described in detail. As used herein, the term "to" between two numerical values indicates that the numeric values before and after the term are inclusive as the lower limit value and the upper limit value, respectively.
<<Configuration of Organic Electroluminescent Element>>

Figure 1:
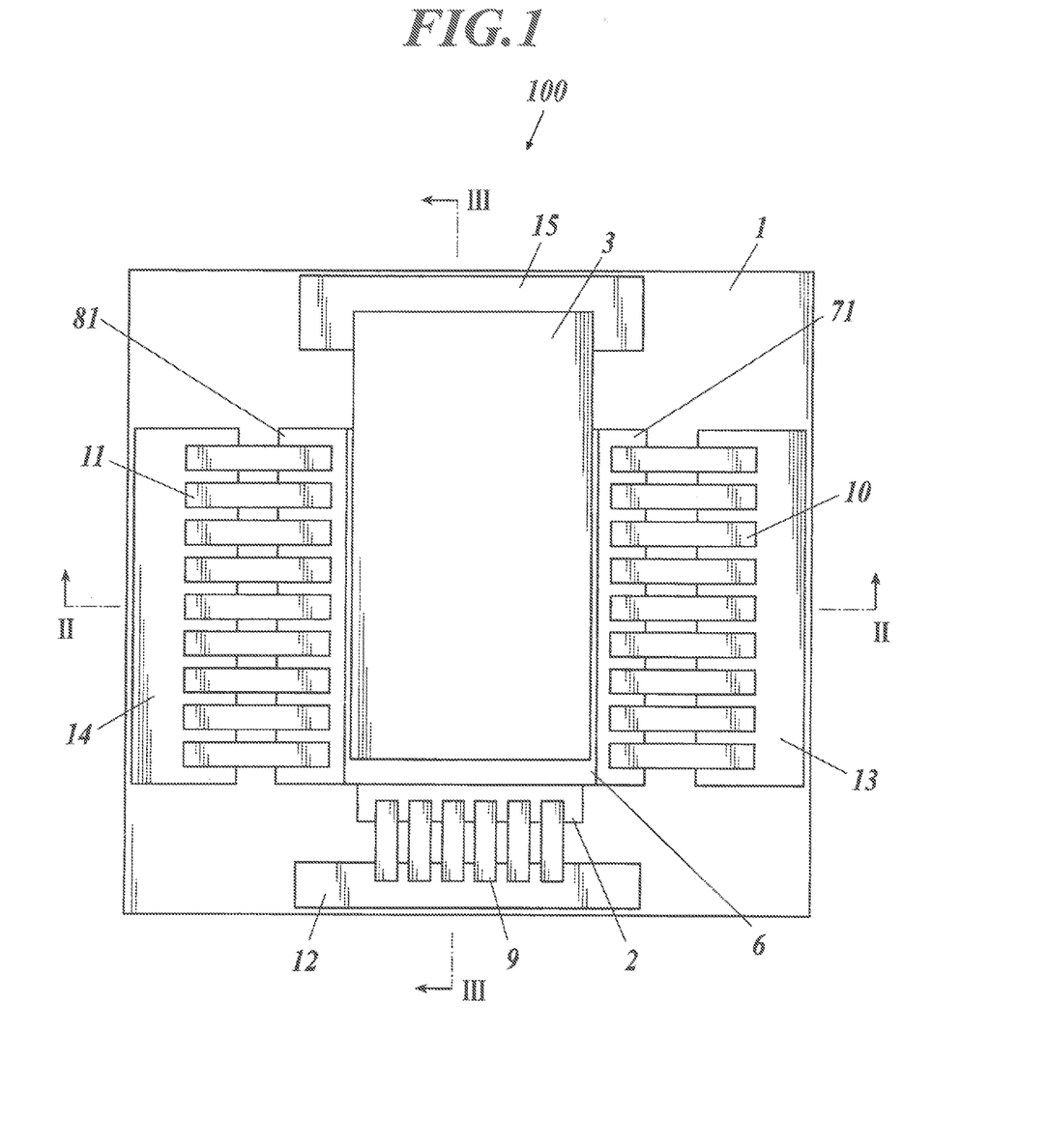
FIG. 1 is a plan view of an example configuration of the organic electroluminescent element according to the present invention.
Figure 2:
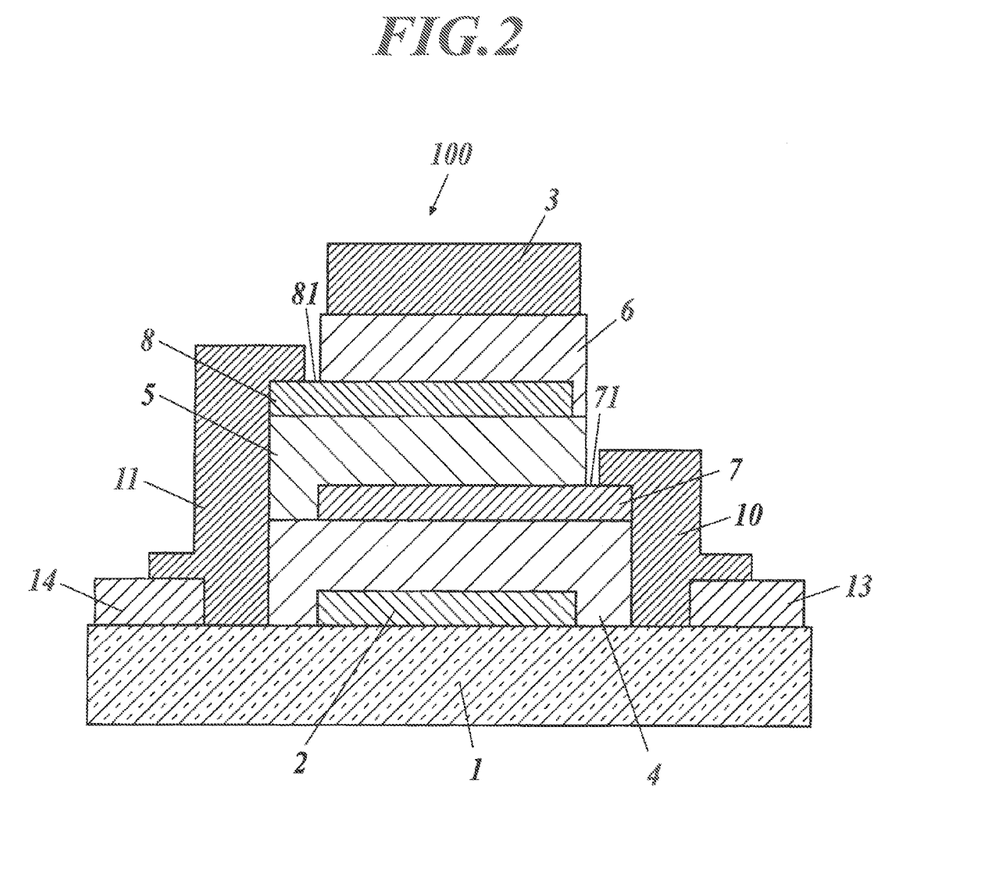
FIG. 2 is a cross-sectional view of the organic electroluminescent element of FIG. 1, taken along line II-II.
Figure 3:
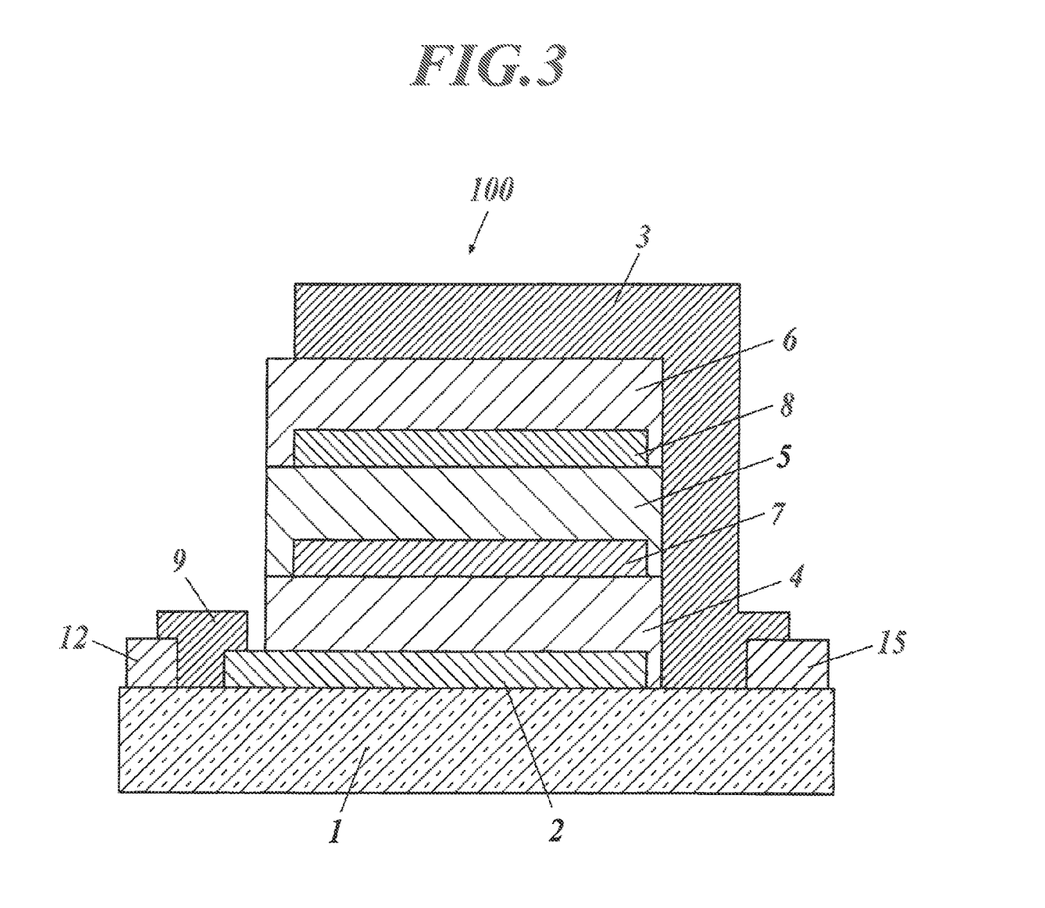
FIG. 3 is a cross-sectional view of the organic electroluminescent element of FIG. 1, taken along line III-III.
Figure 4:
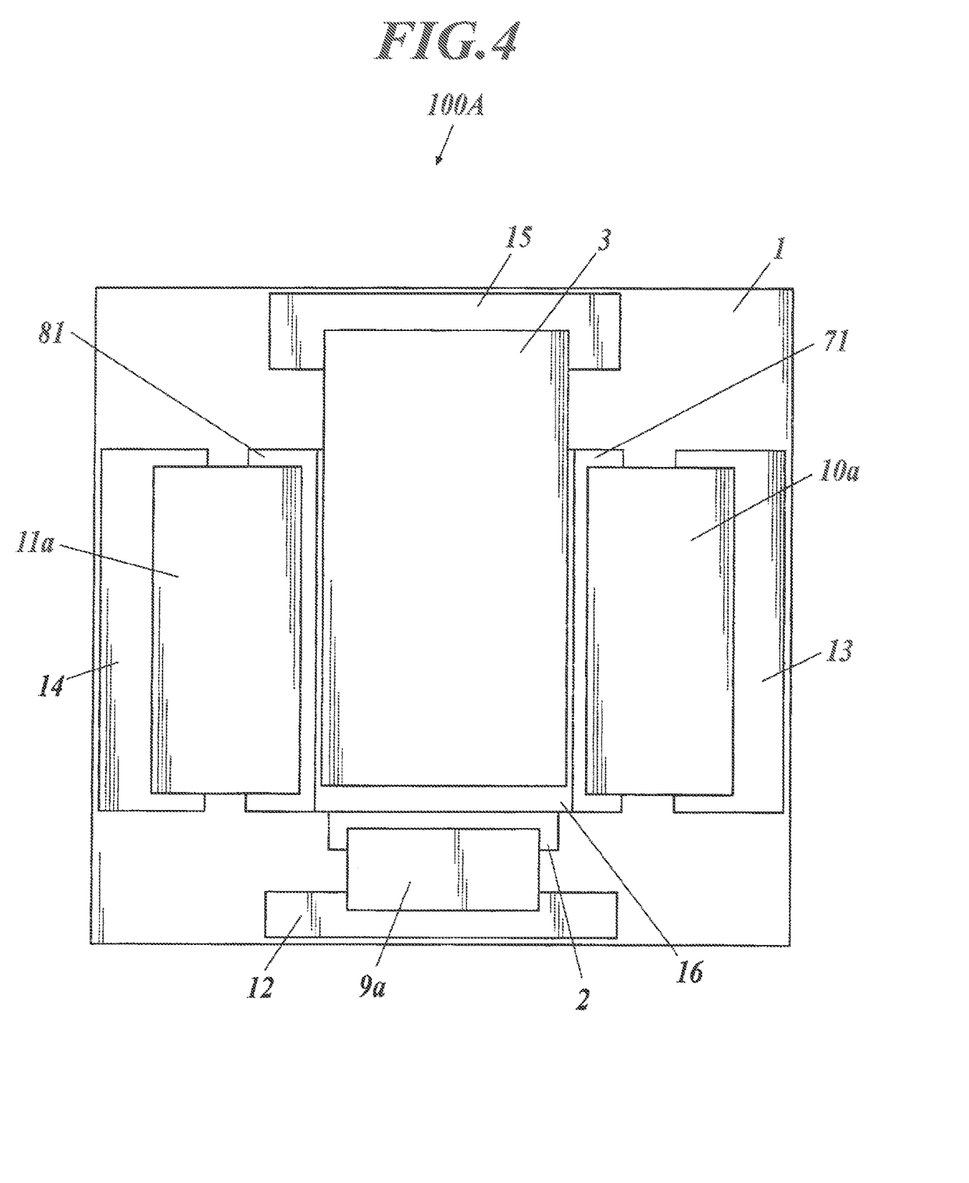
FIG. 4 is a plan view of the configuration of a modification of the organic electroluminescent element according to the present invention.
Figure 5:
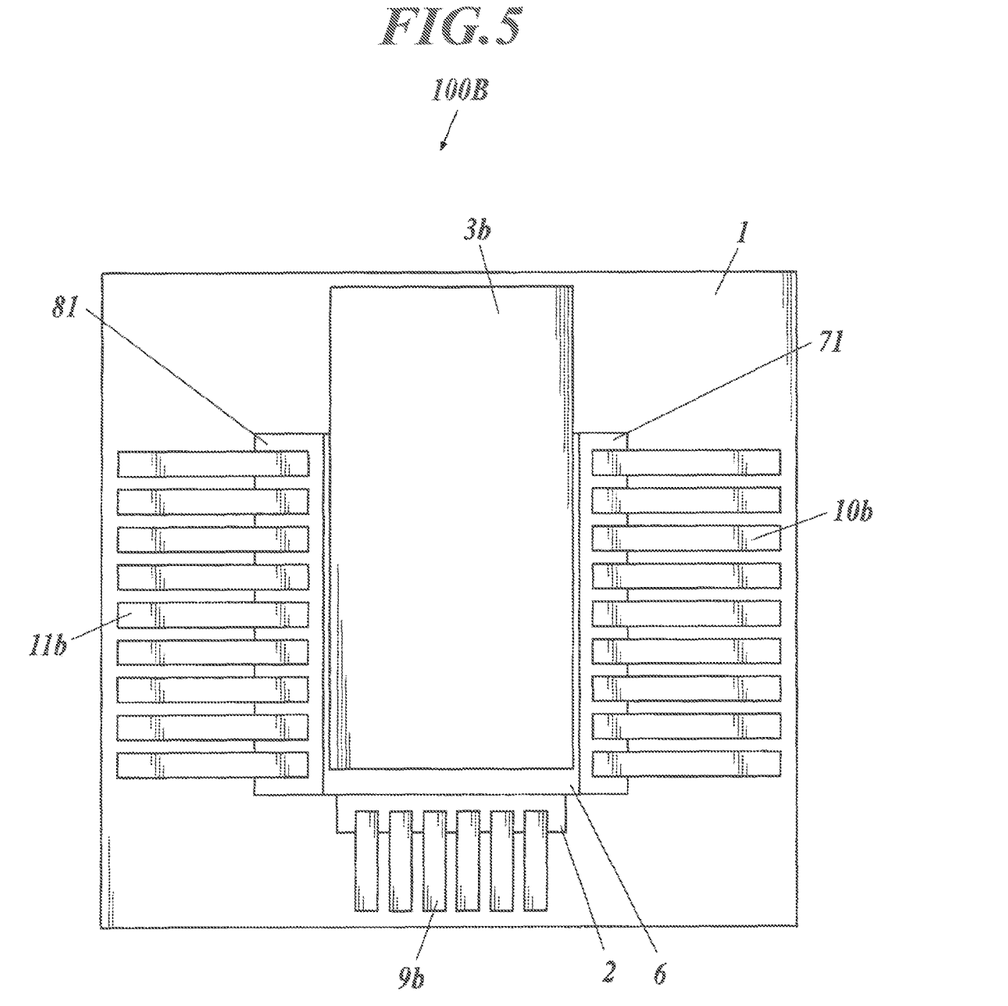
FIG. 5 is a plan view of the configuration of another modification of the organic electroluminescent element according to the present invention.

The organic electroluminescent element (hereinafter also referred to as "organic EL element") of the present invention can be provided in various forms, and examples thereof are illustrated in FIGS. 1 to 5. FIG. 1 is a plan view of an organic EL element 100. FIG. 2 is a cross-sectional view of the organic EL element of FIG. 1, taken along line II-II. FIG. 3 is a cross-sectional view of the organic EL element of FIG. 1, taken along line III-III. FIG. 4 is a plan view of an organic EL element 100A, which is a modification of the organic EL element 100. FIG. 5 is a plan view of an organic EL element 100B, which is another modification of the organic EL element 100.

With reference to FIGS. 1 and 2, the organic EL element 100 of the present invention includes a translucent substrate 1; a first electrode 2 formed on the substrate 1; a second electrode 3 disposed opposite to the first electrode 2; light emitting units 4 to 6 disposed between the first electrode 2 and the second electrode 3, each of the light emitting units 4 to 6 being an organic layer unit including at least a light emitting layer; an intermediate electrode 7 disposed between the light emitting units 4 and 5; an intermediate electrode 8 disposed between the light emitting units 5 and 6; an auxiliary line 9 for connecting the first electrode 2 to an external power source (not illustrated); first lead lines 10 and 11 for respectively connecting the intermediate electrodes 7 and 8 to the external power source; and second lead lines 12 to 15 disposed on the substrate 1 and connected directly to the external power source.

The organic EL element 100 is of a bottom emission type in which the first electrode 2 has translucency and the second electrode 3 has reflectivity such that light emitted from the light emitting units 4 to 6 is extracted through the substrate 1. The organic EL element 100 may be of a top emission type in which the first electrode 2 has reflectivity and the second electrode 3 has translucency. Alternatively, the organic EL element 100 may be of a see-through type in which the substrate 1, the first electrode 2, and the second electrode 3 have translucency such that light is emitted through both surfaces of the element.

The light emitting units 4 to 6 are organic EL layers which emit light of different colors. The color of light extracted to the outside of the element can be controlled by adjusting the intensity of light emitted from each of the light emitting units 4 to 6, whereby light of any color can be emitted from the element. Although at least one of the light emitting units 4 to 6 preferably emits light having a color different from that of light emitted from the remaining light emitting units, the colors of light emitted from the light emitting units 4 to 6 are not necessarily different from one another. The color of light emitted from each of the light emitting units 4 to 6 may optionally be varied. For example, the light emitting units 4 and 5 may emit light having a single color, and the color may be different from that of light emitted from the light emitting unit 6. Alternatively, all the light emitting units 4 to 6 may emit light having a single color.

In the present invention, as illustrated in FIGS. 1 and 2, the light emitting unit 5 adjacent to the intermediate electrode 7 is patterned such that a portion of the intermediate electrode 7 is exposed to the outside as viewed in the direction of lamination of the layers; i.e., an exposed portion 71 is provided.

Similarly, as illustrated in FIGS. 1 and 2, the light emitting unit 6 adjacent to the intermediate electrode 8 is patterned such that a portion of the intermediate electrode 8 is exposed to the outside as viewed in the direction of lamination of the layers; i.e., an exposed portion 81 is provided.

These exposed portions 71 and 81 only need to be in contact with the first lead lines 10 and 11, respectively, such that the intermediate electrodes 7 and 8 are electrically connected to the lines 10 and 11, respectively. Each of the exposed portions 71 and 81 may have any area.

The auxiliary line 9 is provided for connecting the first electrode 2 to the second lead line 12. Thus, the first electrode 2 is connected to the external power source.

As illustrated in FIGS. 1 and 2, the first lead line 10 is provided for connecting the exposed portion 71 of the intermediate electrode 7 to the second lead line 13. Unlike the intermediate electrodes 7 and 8, the first lead line 10 need not be thinned. Accordingly, the first lead line 10, which has a sufficiently large thickness, does not suffer from breakage or an increase in resistance. As described above, the first lead line 10 on the exposed portion 71 of the intermediate electrode 7 is connected to the second lead line 13. Thus, even if the intermediate electrode 7 has a sufficiently small thickness for achieving translucency, the intermediate electrode 7 exhibits stable conductivity.

Similarly, as illustrated in FIGS. 1 and 2, the first lead line 11 is provided for connecting the exposed portion 81 of the intermediate electrode 8 to the second lead line 14, whereby the intermediate electrode 8 is connected to the external power source.

This configuration enables voltage to be applied to the light emitting units 4 to 6 individually, so that the emission intensity of each of the light emitting units 4 to 6 can be adjusted.

As illustrated in FIG. 1, the auxiliary line 9, which connects the first electrode 2 to the second lead line 12, is formed of a plurality of segments, and the first lead line 10 or 11, which connects the intermediate electrode 7 or 8 to the second lead line 13 or 14, consists of a plurality of divided segments. This configuration can prevent a decrease in strength of a metal mask or deflection of the mask during patterning of the auxiliary line 9 or the first lead line 10 or 11 with the metal mask by vacuum vapor deposition. As illustrated in FIG. 4, each of the auxiliary line 9 and the first lead lines 10 and 11 may be formed through patterning of a single continuous film.

With reference to FIG. 4, the organic EL element 100A includes an auxiliary line 9a and first lead lines 10a and 11a, each of which is formed through patterning of a single continuous film at a specific position, instead of being formed of a plurality of segments.

This configuration facilitates patterning of the auxiliary line 9a and the first lead lines 10a and 11a.

The second lead lines 12 to 15 are provided at the peripheral edges of the substrate 1 and connected to a non-illustrated external power source. Specifically, the auxiliary line 9 is connected to the external power source via the second lead line 12, the first lead lines 10 and 11 are connected to the external power source via the second lead lines 13 and 14, respectively, and the second electrode 3 is connected to the external power source via the second lead line 15.

The second lead lines 12 to 15 are provided for, for example, reducing interconnection resistance in the substrate 1 and achieving good connection between the element and the external power source. As illustrated in FIG. 5, the second lead lines 12 to 15 may optionally be omitted.

With reference to FIG. 5, the organic EL element 100B includes no second lead lines, wherein a second electrode 3b, an auxiliary line 9b, and first lead lines 10b and 11b extend to the peripheral edges of the substrate 1.

Thus, the organic EL element 100 does not require a process of forming the second lead lines 12 to 15, and has a simple configuration. As in the organic EL element 100A, each of the auxiliary line 9b and the first lead lines 10b and 11b may be formed of a single continuous film through patterning at a specific position in the organic EL element 100B.

In the organic EL element 100 having the aforementioned configuration, each of the intermediate electrodes 7 and 8 has a very small thickness for effective extraction of light emitted from the light emitting units 4 to 6, and the first lead lines 10 and 11 are in contact with the exposed portions 71 and 81 of the intermediate electrodes 7 and 8 and are connected to the second lead lines 13 and 14, respectively. Thus, the thin intermediate electrode 7 or 8 does not need to extend over a step between the light emitting units 4 and 5 or between the light emitting units 5 and 6. Therefore, the organic EL element 100 exhibits both high translucency and favorable electrical connection.

Three light emitting units are provided in the embodiment shown in FIGS. 1 to 3. Alternatively, two or four or more light emitting units may be provided. Regardless of the number of light emitting units, an intermediate electrode is disposed between each pair of adjacent light emitting units, and the intermediate electrode has an exposed portion which is connected to a first lead line. For example, if the number of light emitting units is n (an integer of 2 or more), the number of intermediate electrodes or first lead lines is n−1.

A sealant (not illustrated) is provided on the substrate 1 of the organic EL element 100 for preventing degradation of, for example, the light emitting units 4 to 6. As described below, the sealant may be a sealing plate provided with an adhesive, or may be a sealing film provided to cover the individual layers on the substrate 1. It should be noted that the ends of the second lead lines 12 to 15 are exposed through the sealant while being insulated from one another. In the organic EL element 100B illustrated in FIG. 5, the ends of the second electrode 3b, the auxiliary line 9b, and the first lead lines 10b and 11b are exposed through the sealant while being insulated from one another.

<<Production of Organic EL Element>>

Now will be described a process of producing the organic EL element 100 having the aforementioned configuration.

Second lead lines 12 to 15 are formed at four edges of a substrate 1, and a first electrode 2 is then formed on the substrate 1.

A light emitting unit 4 is then formed on the first electrode 2. Specifically, the light emitting unit 4 is patterned such that a portion of the first electrode 2 is exposed, and the first electrode 2 and the second lead line 12 are connected via an auxiliary line 9.

An intermediate electrode 7 is then formed on the light emitting unit 4. Specifically, the intermediate electrode 7 is patterned such that the intermediate electrode 7 is not electrically connected to the first electrode 2. The intermediate electrode 7 is preferably patterned so as not to extend beyond the top surface of the light emitting unit 4.

A light emitting unit 5 is then formed on the intermediate electrode 7. The light emitting unit 5 is patterned such that a portion of the intermediate electrode 7 is exposed as viewed in the direction of lamination, and the intermediate electrode 7, which is formed on the light emitting unit 4, is connected to a first lead line 10 in a subsequent step.

An intermediate electrode 8 is then formed on the light emitting unit 5. Specifically, the intermediate electrode 8 is patterned such that the intermediate electrode 8 is not electrically connected to the first electrode 2 or the intermediate electrode 7. The intermediate electrode 8 is preferably patterned so as not to extend beyond the top surface of the light emitting unit 5.

A light emitting unit 6 is then formed on the intermediate electrode 8. The light emitting unit 6 is patterned such that a portion of the intermediate electrode 8 is exposed as viewed in the direction of lamination, and the intermediate electrode 8, which is formed on the light emitting unit 5, is connected to a first lead line 11 in a subsequent step.

A second electrode 3 is then formed on the light emitting unit 6. Specifically, the second electrode 3 is patterned such that the second electrode 3 is not electrically connected to the first electrode 2 or the intermediate electrode 7 or 8. The second electrode 3 need not have translucency if emitted light is extracted through the first electrode 2. In such a case, the second electrode 3 can have a sufficiently large thickness. Thus, the second electrode 3 can be patterned such that one end of the second electrode 3 is connected directly to the second lead line 15 without consideration of breakage due to a step between layers or an increase in resistance. As in the intermediate electrodes 7 and 8, a first lead line may be additionally provided on the second electrode 3, and the second electrode 3 may be connected to the second lead line 15 via the first lead line.

An auxiliary line 9 is patterned so as to come into contact with the first electrode 2 and the second lead line 12, whereby the first electrode 2 is electrically connected to the second lead line 12. In this case, the auxiliary line 9 is patterned such that the auxiliary line 9 is not electrically connected to the second electrode 3, the intermediate electrodes 7 and 8, or the second lead lines 13 to 15 for prevention of short circuit.

A first lead line 10 is then patterned so as to come into contact with the exposed portion 71 of the intermediate electrode 7 and the second lead line 13, whereby the intermediate electrode 7 is electrically connected to the second lead line 13. In this case, the first lead line 10 is patterned such that the first lead line 10 is not electrically connected to the first electrode 2, the second electrode 3, the intermediate electrode 8, the auxiliary line 9, or the second lead lines 12, 14, and 15 for prevention of short circuit.

A first lead line 11 is then patterned so as to come into contact with the exposed portion 81 of the intermediate electrode 8 and the second lead line 14, whereby the intermediate electrode 8 is electrically connected to the second lead line 14. In this case, the first lead line 11 is patterned such that the first lead line 11 is not electrically connected to the first electrode 2, the second electrode 3, the intermediate electrode 7, the auxiliary line 9, the first lead line 10, or the second lead lines 12, 13, and 15 for prevention of short circuit.

The auxiliary line 9 and the first lead lines 10 and 11 may be separately formed, or may be simultaneously formed through, for example, patterning with a mask. Alternatively, the second electrode 3 may be formed through patterning together with these lead lines. This process can reduce the number of steps of forming layers, the number of chambers for forming layers, and the number of deposition masks.

If the second electrode 3, the auxiliary line 9, and the first lead lines 10 and 11 are simultaneously patterned by vacuum vapor deposition, the organic EL element 100 can be produced with any existing production apparatus.

The layers forming the organic EL element 100 can be formed by the processes described below. If the layers are formed by vacuum vapor deposition, the organic EL element 100 can be readily produced with any existing vacuum vapor deposition line. Even if some of the layers are formed by a coating process, the organic EL element 100 can be readily produced by appropriately adjusting the pressure for forming the layers.

The above-described lamination process can produce an organic EL element 100 including an intermediate electrode which has translucency sufficient for effective extraction of light emitted from a light emitting layer to the outside, and which is connected to an external power source without causing breakage or an increase in resistance.

Now will be described layers essential for the organic EL element 100 in detail, and processes of forming the layers.

<<Substrate>>

The substrate 1 used for the organic EL element 100 of the present invention may be composed of any glass or plastic material, and may be transparent or opaque. In the illustrated embodiment, the substrate 1 is a transparent substrate through which light is extracted. The transparent substrate 1 is preferably a glass, quartz, or transparent resin film. Particularly preferred is a resin film which can impart flexibility to the organic EL element 100.

The substrate 1 may have any thickness.

Examples of the resin film include films of polyesters, such as poly(ethylene terephthalate) (PET) and poly(ethylene naphthalate) (PEN), polyethylene, polypropylene, cellophane, cellulose esters and their derivatives, such as cellulose diacetate, cellulose triacetate (TAC), cellulose acetate butyrate, cellulose acetate propionate (CAP), cellulose acetate phthalate, and cellulose nitrate, poly(vinylidene chloride), poly(vinyl alcohol), poly(ethylene-co-vinyl alcohol), syndiotactic polystyrene, polycarbonates, norbornene resins, polymethylpentene, polyether ketones, polyimides, polyethersulfone (PES), poly(phenylene sulfide), polysulfones, polyether imide, polyether ketone imide, polyamides, fluororesins, nylon, poly(methyl methacrylate), acrylic resins, polyarylates, and cycloolefin resins, such as ARTON (trade name, manufactured by JSR Corp.) and APEL (trade name, manufactured by Mitsui Chemicals Inc.).

The resin film may be coated with a gas barrier film composed of an inorganic or organic substance, or both. The gas barrier film is preferably, for example, a gas barrier film having a water vapor transmission rate (25±0.5° C., relative humidity (90±2)% RH) of 0.01 g/(m$^2$·24 h) or less as determined in accordance with JIS K 7129-1992. The gas barrier film is more preferably a high gas barrier film having an oxygen transmission rate of $1 \times 10^{-3}$ mL/m$^2$·24 h·atm or less as determined in accordance with JIS K 7126-1987 and a water vapor transmission rate of $1 \times 10^{-5}$ g/m$^2$·24 h or less.

The gas barrier film may be composed of any material capable of preventing intrusion of a substance which impairs the organic EL element, such as moisture or oxygen. Examples of the material include silicon oxide, silicon dioxide, and silicon nitride. In view of enhancement of the strength, the gas barrier film preferably has a layered structure composed of an inorganic layer and an organic material layer. The inorganic layer and the organic layer may be disposed in any order. Preferably, a plurality of inorganic layers and organic layers are alternately disposed.

The gas barrier film may be formed by any known process. Examples of the process include vacuum vapor deposition, sputtering, reactive sputtering, molecular beam epitaxy, the ionized-cluster beam method, ion plating method, plasma polymerization, atmospheric pressure plasma polymerization, plasma CVD, laser CVD, thermal CVD, and coating. In particular, the gas barrier film is preferably formed through atmospheric pressure plasma polymerization as described in Japanese Unexamined Patent Application Publication No. 2004-68143.

Examples of the opaque supporting substrate include metal plates, such as aluminum plates and stainless steel plates, opaque resin substrates, and ceramic substrates.

<<First Electrode>>

The first electrode 2 may be any electrode which can typically be used for an organic EL element. Specific examples of the material for the first electrode 2 include aluminum, silver, magnesium, lithium, mixtures of magnesium and copper, mixtures of magnesium and silver, mixtures of magnesium and aluminum, mixtures of magnesium and indium, indium, mixtures of lithium and aluminum, rare-earth metals, and oxide semiconductors, such as ITO, ZnO, SnO$_2$, and aluminum-doped TiO$_2$.

In the present invention, the first electrode 2 is preferably a transparent electrode, more preferably a transparent metal electrode. The "transparency" of the first electrode 2 corresponds to a light transmittance of 50% or more at a wavelength of 550 nm.

The first electrode 2 may be appropriately formed by any known process, such as spin coating, vapor deposition, or sputtering. The first electrode 2 may be patterned by an appropriately selected process, such as known photolithography or patterning with a mask. For extraction of emitted light through the first electrode 2, the first electrode 2 preferably has a transmittance exceeding 10%. The first electrode 2 preferably has a sheet resistance of several hundreds of Ω/square or less.

The thickness of the first electrode 2, which may vary depending on the material thereof, is typically 10 to 1,000 nm, preferably 10 to 200 nm.

The first electrode 2 may have a two-layer structure including a primary layer disposed on the substrate 1 and an electrode layer disposed on the primary layer. The electrode layer is composed of, for example, silver or an alloy containing silver as a main component. The primary layer is composed of, for example, a compound containing a nitrogen atom. The "main component" of the electrode layer refers to a component contained in the electrode layer in an amount of 98 mass % or more.

<<Second Electrode>>

The second electrode 3 is an electrode film serving as a cathode which supplies electrons to the light emitting units 4 to 6. The second electrode 3 is composed of a metal, an alloy, an organic or inorganic conductive compound, or a mixture thereof. Specific examples of the material for the second electrode 3 include aluminum, silver, magnesium, lithium, mixtures of magnesium and copper, mixtures of magnesium and silver, mixtures of magnesium and aluminum, mixtures of magnesium and indium, indium, mixtures of lithium and aluminum, rare-earth metals, and oxide semiconductors, such as ITO, ZnO, TiO$_2$, and SnO$_2$. The material for the second electrode 3 is preferably aluminum or silver in view of handling, for example.

The second electrode 3 may be formed by any known process, such as vacuum vapor deposition with resistance heating, sputtering, or electron beam (EB) vapor deposition. Sputtering or EB vapor deposition is preferably used for mass production of the organic EL element 100 in view of continuous production. The second electrode 3 preferably has a sheet resistance of several hundreds of Ω/square or less. The thickness of the second electrode 3, which may vary depending on the material thereof, is preferably 100 to 300 nm. A thickness of 300 nm or less leads to a reduction in time for formation of the second electrode 3, and results in inhibition of film stress or reliable prevention of removal of the electrode.

If the organic EL element 100 is configured to extract emitted light through the second electrode 3, the second electrode 3 is composed of a highly translucent material selected from the aforementioned conductive materials.

<<Light Emitting Unit>>

Each of the light emitting units 4 to 6 includes a light emitting layer directly responsible for emission, and also includes an organic layer, such as a carrier (hole or electron) injecting layer, a carrier blocking layer, or a carrier transporting layer. Each of the light emitting units 4 to 6 preferably has a thickness of 80 to 200 nm for efficient light extraction. A thickness of 80 nm or more leads to reliable reduction of leakage and improvement in durability of each of the light emitting units 4 to 6, whereas a thickness of 200 nm or less prevents an increase in driving voltage.

Each of the light emitting units 4 to 6 preferably has a layer configuration as described below. Each light emitting unit, which includes a light emitting layer, may have a layer configuration other than the below-described ones. For example, each of the light emitting units 4 to 6 may have a single-layer structure including only a light emitting layer. In each of the layer configurations (1) to (7) described below, the first layer is laminated adjacent to the first electrode 2, and following layers are subsequently laminated on the side facing the second electrode 3. The light emitting units 4 to 6 may have different layer configurations from one another.

(1) Light emitting layer/electron transporting layer (2) Hole transporting layer/light emitting layer (3) Hole transporting layer/light emitting layer/electron transporting layer (4) Hole transporting layer/light emitting layer/hole blocking layer/electron transporting layer (5) Hole transporting layer/light emitting layer/hole blocking layer/electron transporting layer/electron injecting layer (cathode buffer layer)

(6) Hole injecting layer (anode buffer layer)/hole transporting layer/light emitting layer/hole blocking layer/electron transporting layer/electron injecting layer (7) Hole injecting layer/hole transporting layer/light emitting layer/electron transporting layer/electron injecting layer Each of these organic layers may be formed by any known process, such as vacuum vapor deposition with resistance heating, spin coating, or inkjet coating.

These organic layers will now be described. Description of specific materials for the organic layers is omitted, because the organic layers can be composed of known materials.

(1) Light Emitting Layer

The light emitting layer emits light through recombination of holes injected directly or via a hole transporting layer from the first electrode 2 and electrons injected directly or via an electron transporting layer from the second electrode 3. A light-emitting portion may be located within the light emitting layer or at the interface between the light emitting layer and the layer adjacent thereto. A single light emitting unit may include a plurality of light emitting layers.

The light emitting layer is preferably composed of an organic light emitting material containing a host compound (host material) and a light emitting material (light emitting dopant). The resulting light emitting layer may emit light of any color, which depends on, for example, the emission wavelength of the appropriately selected type of light emitting material. In the present invention, at least one of the light emitting layer in the light emitting units 4 to 6 preferably emits light having a color different from that of light emitted from the remaining light emitting units.

The total thickness of the light emitting layers can be appropriately determined in consideration of, for example, intended emission properties. For example, the total thickness of the light emitting layers is preferably 1 to 200 nm, in view of the homogeneity of the light emitting layers, inhibition of application of unnecessarily high voltage upon light emission, and an improvement in stability of emission color against driving current. In particular, the total thickness of the light emitting layers is preferably 30 nm or less, in view of a reduction in driving voltage.

The host compound contained in the light emitting layer exhibits a phosphorescence quantum yield at room temperature (25° C.) of preferably 0.1 or less, more preferably 0.01 or less. The ratio by volume of the host compound to all the compounds contained in the light emitting layer is preferably 50% or more.

The light emitting material contained in the light emitting layer may be, for example, a phosphorescent material (phosphorescent compound) or a fluorescent material. A single light emitting layer may contain a single light emitting material or a plurality of light emitting materials having different maximum emission wavelengths. A light emitting layer containing a plurality of light emitting materials can emit light of different emission wavelengths, thereby emitting light of any color. For example, a light emitting layer containing three light emitting materials (blue light-emitting, green light-emitting, and red light-emitting materials) can emit white light.

(2) Injecting Layer (Hole Injecting Layer or Electron Injecting Layer)

The injecting layer is provided for a reduction in driving voltage or an increase in luminance, and is generally disposed between an electrode and a light emitting layer. Injecting layers are roughly classified into a hole (carrier) injecting layer (anode buffer layer) and an electron (carrier) injecting layer (cathode buffer layer). The hole injecting layer is disposed between the first electrode 2 and the light emitting layer or the hole transporting layer. The electron injecting layer is disposed between the second electrode 3 and the light emitting layer or the electron transporting layer.

(3) Blocking Layer (Hole Blocking Layer or Electron Blocking Layer)

The blocking layer is provided for blocking transportation of carriers (holes or electrons). Blocking layers are roughly classified into a hole (carrier) blocking layer and an electron (carrier) blocking layer.

The hole blocking layer functions as the below-described electron transporting layer in a broad sense. The hole blocking layer is composed of a material which transports electrons and has a low capability of transporting holes. Provision of the hole blocking layer leads to well-balanced injection of holes and electrons into the light emitting layer. The hole blocking layer can increase the probability of recombination of electrons and holes.

The below-described electron transporting layer may optionally be used as the hole blocking layer. The hole blocking layer is preferably disposed adjacent to the light emitting layer.

The electron blocking layer functions as the below-described hole transporting layer in a broad sense. The electron blocking layer is composed of a material which transports holes and has a low capability of transporting electrons. Provision of the electron blocking layer leads to well-balanced injection of holes and electrons into the light emitting layer. The electron blocking layer can increase the probability of recombination of electrons and holes.

The below-described hole transporting layer may optionally be used as the electron blocking layer.

The blocking layer may have any thickness. The thickness is preferably 3 nm to 100 nm, more preferably 5 nm to 30 nm.

(4) Transporting Layer (Hole Transporting Layer or Electron Transporting Layer)

The transporting layer is provided for transportation of carriers (holes or electrons). Transporting layers are roughly classified into a hole (carrier) transporting layer and an electron (carrier) transporting layer.

The hole transporting layer transports (injects) holes supplied from the first electrode 2 into the light emitting layer. The hole transporting layer is disposed between the light emitting layer and the first electrode 2 or the hole injecting layer. The hole transporting layer also serves as a barrier for blocking entrance of electrons from the second electrode 3. Thus, the term "hole transporting layer" may refer to a hole injecting layer and/or an electron blocking layer in a broad sense. One or more hole transporting layers may be provided.

The electron transporting layer transports (injects) electrons supplied from the second electrode 3 into the light emitting layer. The electron transporting layer is disposed between the light emitting layer and the second electrode 3 or the electron injecting layer. The electron transporting layer also serves as a barrier for blocking entrance of holes from the first electrode 2. Thus, the term "electron transporting layer" may refer to an electron injecting layer and/or a hole blocking layer in a broad sense. One or more electron transporting layers may be provided.

In the electron transporting layer having a single-layer or multi-layer structure, an electron transporting sublayer disposed adjacent to the light emitting layer may be composed of any material (also serving as a hole blocking material) capable of transferring (transporting) electrons injected from the first electrode 2 into the light emitting layer.

<<Intermediate Electrode>>

The intermediate electrodes 7 and 8 are required to have both conductivity and translucency. Thus, the intermediate electrodes 7 and 8 are preferably composed of a thin metal film containing aluminum, silver, magnesium, lithium, or calcium; specifically, a thin film having a thickness of 20 nm or less. Alternatively, the intermediate electrodes 7 and 8 may be composed of a thin film containing a metal compound, such as lithium fluoride or cesium fluoride.

The intermediate electrodes 7 and 8 may be formed by any known process, such as vacuum vapor deposition with resistance heating, sputtering, or EB vapor deposition. In particular, the intermediate electrodes 7 and 8, which are respectively disposed on the light emitting units 4 and 5, are preferably formed through vapor deposition with resistance heating for reliably reducing damage to the light emitting units 4 and 5 during formation of the intermediate electrodes 7 and 8.

The thickness of the intermediate electrode 7 or 8, which may vary depending on the material thereof, is 1 to 30 nm. In the present invention, the intermediate electrodes 7 and 8 respectively have the exposed portions 71 and 81, which are connected to the external power source via the first lead lines 10 and 11, respectively. Accordingly, the intermediate electrode 7 or 8 need not be thickened for preventing breakage or an increase in resistance. Thus, in the present invention, the thickness of the intermediate electrode 7 or 8 can be adjusted to 20 nm or less without causing breakage or an increase in resistance, whereby high translucency can be achieved.

<<First Lead Line and Auxiliary Line>>

The first lead lines 10 and 11 need to be composed of a low-resistance material for achieving favorable electrical connection. For example, the first lead lines 10 and 11 may be composed of Al or an Mo/Al/Mo layered structure, but are not necessarily composed of such a material. The first lead lines 10 and 11 may be composed of the same material as the second electrode 3 described above.

The first lead lines 10 and 11 may be formed by any known process, such as vacuum vapor deposition with resistance heating, sputtering, or EB vapor deposition.

The first lead line 10 or 11, which may have any thickness, preferably has a thickness of 50 to 300 nm, more preferably 100 to 300 nm. As used herein, the "thickness" of the first lead line 10 or 11 refers to a thickness as determined in the direction of lamination in the element. Each of the thinnest and thickest portions of the first lead line 10 and 11 preferably has a thickness falling within the aforementioned range. The first lead line 10 or 11 is provided to extend over a step between layers of the organic EL element 100. Thus, a thickness of 100 nm or more reliably results in a desired resistance, whereas a thickness of 300 nm or less leads to a reduction in time for formation of the first lead line 10 or 11, inhibition of film stress, and reliable prevention of removal of the lead line.

The auxiliary line 9 is formed as in the first lead lines 10 and 11.

<<Second Lead Line>>

The second lead lines 12 to 15 are provided for reducing interconnection resistance in the substrate 1 and achieving good connection between the element and the external power source. Thus, the second lead lines 12 to 15 are preferably composed of a material having low resistance and high corrosion resistance. Examples of the material include, but are not limited to, Al alloys, molybdenum-coated Al alloys, and titanium nitride-coated Al alloys.

The second lead lines 12 to 15 may be appropriately formed by any known process, such as spin coating, vapor deposition, or sputtering. Alternatively, the second lead lines may be patterned by an appropriately selected process, such as known photolithography or patterning with a mask.

The second lead lines 12 to 15 may have any thickness. A thickness of 1 μm or more is preferred for a reduction in resistance, and a thickness of 300 to 500 nm is more preferred in view of production cost and easy patterning.

<<Sealant>>

The sealant is provided on the substrate 1 to cover the main components of the organic EL element (including the light emitting units 4 to 6, the electrodes, and the lines). The sealant may be in the form of a plate (film) fixed on the substrate 1 with an adhesive, or may be in the form of a sealing film. Regardless of its form, the sealant seals the organic EL element 100 such that ends of the second lead lines 12 to 15 are exposed to the outside. In the configuration of the organic EL element 100B shown in FIG. 5, the sealant seals the organic EL element 100B such that ends of the second electrode 3, the auxiliary line 9, and the first lead lines 10 and 11 are exposed to the outside.

If the sealant is provided in the form of plate (film), the member may have a depression on one side, i.e., be in the form of a concave plate, or have a flat surface, i.e., be in the form of a flat plate. The (concave or flat) sealing plate is provided such that the main components of the organic EL element are disposed between the sealing plate and the substrate 1.

The sealant may be a transparent substrate, such as a glass plate, a polymer plate, or a metal plate. Examples of the glass plate include substrates composed of glass materials, such as alkali-free glass, soda-lime glass, barium-strontium-containing glass, lead glass, aluminosilicate glass, borosilicate glass, barium borosilicate glass, and quartz. Examples of the polymer plate include substrates composed of polymer materials, such as polycarbonates, acrylic resins, polyethylene terephthalate), polyether sulfides, and polysulfones. Examples of the metal plate include substrates composed of one or more metals selected from the group consisting of stainless steel, iron, copper, aluminum, magnesium, nickel, zinc, chromium, titanium, molybdenum, silicon, germanium, and tantalum and alloys of the metals.

If the sealant is a concave sealing plate (for encapsulation sealing), the space between the sealant and the main components of the organic EL element (including the light emitting units 4 to 6, the electrodes, and the lines) is preferably filled with an inert gas, such as nitrogen or argon, or an inert liquid, such as fluorohydrocarbon or silicone oil. The space between the sealant and the main components of the organic EL element may be in a vacuum state, or may be filled with a hygroscopic compound.

If the sealant is a flat sealing plate, the sealant is bonded to the substrate 1 with an adhesive. Examples of the adhesive include photocurable and thermosetting adhesives containing reactive vinyl groups of acrylic acid oligomers and methacrylic acid oligomers, moisture-curable adhesives, such as 2-cyanoacrylate esters, and thermosetting and chemical-curable adhesives (two-component adhesives), such as epoxy adhesives.

As described above, the sealant may be a sealing film.

The sealing film may be composed of an inorganic material or an organic material. It should be noted that the sealing film is composed of a material capable of preventing intrusion of a substance which impairs the light emitting units 4 to 6, such as moisture or oxygen. Examples of the material include inorganic materials, such as silicon monoxide, silicon dioxide, and silicon nitride. In view of enhancement of the strength, the sealing film may have a multi-layer structure including a film made of such an inorganic material and a film made of an organic material.

The sealing film may be formed by any known process. Examples of the process include vacuum vapor deposition, sputtering, reactive sputtering, molecular beam epitaxy, the ionized-cluster beam method, ion plating method, plasma polymerization, atmospheric pressure plasma polymerization, plasma CVD, laser CVD, thermal CVD, and coating.

<<Protective Film, Protective Plate>>

The organic EL element of the present invention may further include a protective film or plate on the sealant.

The protective film or plate is provided on the sealant for mechanically protecting the main components of the organic EL element (including the light emitting units 4 to 6, the electrodes, and the lines), which are disposed between the sealant and the substrate 1. If the sealing film is used for sealing of the main components of the organic EL element, provision of the protective film or plate is particularly preferred, because the main components may be insufficiently protected mechanically.

Examples of the material for the protective film or plate include glass plates, polymer plates, thin polymer films, metal plates, thin metal films, polymer material films, and metal material films. Of these, a polymer film is preferably used in view of a reduction in weight and thickness of the element.

INDUSTRIAL APPLICABILITY

As described above, the present invention provides an organic electroluminescent element with excellent translucency by having a thin intermediate electrode and with high conductivity by suppressing breakage or an increase in resistance of the intermediate electrode.

EXPLANATION OF REFERENCE NUMERALS

1: substrate
2: first electrode
3, 3*b*: second electrode
4 to 6: light emitting unit
7, 8: intermediate electrode
9, 9*a*, 9*b*: auxiliary line
10, 10*a*, 10*b*, 11, 11*a*, 11*b*: first lead line
12 to 15: second lead line
71, 81: exposed portion
100, 100A, 100B: organic EL element

The invention claimed is:

1. An organic electroluminescent element comprising:
a substrate;
a first electrode formed on the substrate;
a second electrode disposed opposite to the first electrode;
a plurality of light emitting units disposed between the first electrode and the second electrode, each of the light emitting units including a light emitting layer;
an intermediate electrode disposed between two adjacent ones of the light emitting units;
a first lead line for connecting the intermediate electrode to an external power source to allow the light emitting units to emit light independently,
wherein the first lead line has a thickness of 50-300 nm,
wherein the light emitting unit adjacent to the intermediate electrode is patterned such that a portion of the intermediate electrode is exposed to the outside as viewed in a direction of lamination, and the first lead line is connected to the exposed portion of the intermediate electrode; and
a second lead line connected to the external power source and disposed on the substrate, wherein the first lead line is in direct physical contact with the second lead line.

2. The organic electroluminescent element according to claim 1, wherein the first lead line is composed of a plurality of patterned segments.

3. The organic electroluminescent element according to claim 1, wherein the second electrode and the first lead line are composed of the same conductive material.

4. The organic electroluminescent element according to claim 1, wherein at least one of the light emitting units emits light having a color different from that of light emitted from the remaining light emitting unit(s).

5. The organic electroluminescent element according to claim 4, wherein the color of light extracted to the outside can be controlled by adjusting the intensity of light emitted from each of the light emitting units.

6. The organic electroluminescent element according to claim 1, wherein the intermediate electrode comprises at least one metal element selected from aluminum, silver, magnesium, and calcium.

7. The organic electroluminescent element according to claim 1, wherein the thickness of the intermediate electrode is 20 nm or less.

8. The organic electroluminescent element according to claim 1, wherein the intermediate electrode is formed by vacuum vapor deposition with a metal mask.

9. The organic electroluminescent element according to claim 1, wherein the first lead line has a thickness of 100 to 300 nm.

10. The organic electroluminescent element according to claim 1, wherein the organic electroluminescent element has two first lead lines that extend in opposing directions from the electroluminescent element.

11. A method for manufacturing an organic electroluminescent element comprising
   a first electrode formed on a substrate;
   a second electrode disposed opposite to the first electrode;
   a plurality of light emitting units disposed between the first electrode and the second electrode, each of the light emitting units including a light emitting layer;
   an intermediate electrode disposed between two adjacent ones of the light emitting units;
   a first lead line for connecting the intermediate electrode to an external power source to allow the light emitting units to emit light independently; and
   a second lead line connected to the external power source and disposed on the substrate,
   which are respectively formed by vacuum vapor deposition,
   the method comprising:
   patterning the light emitting unit adjacent to the intermediate electrode such that a portion of the intermediate electrode is exposed to the outside as viewed in a direction of lamination,
   patterning the second lead line on the substrate, and
   patterning the first lead line to the exposed portion of the intermediate electrode and to the second lead line so that the first lead line has a thickness of 50 to 300 nm and so that the first lead line is in direct physical contact with the second lead line.

\* \* \* \* \*